United States Patent [19]

Kim

[11] Patent Number: 5,081,706
[45] Date of Patent: Jan. 14, 1992

[54] BROADBAND MERGED SWITCH

[75] Inventor: Bumman Kim, Richardson, Tex.

[73] Assignee: Texas Instruments Incorporated, Dallas, Tex.

[21] Appl. No.: 79,733

[22] Filed: Jul. 30, 1987

[51] Int. Cl.⁵ .................. H04B 1/44; H03F 3/60
[52] U.S. Cl. ................. 455/78; 455/326; 330/286; 330/54
[58] Field of Search ............ 330/286, 55, 54, 277, 330/9; 455/78, 326; 333/109, 104, 101, 103, 111, 112, 262; 307/241

[56] References Cited

U.S. PATENT DOCUMENTS

| | | | |
|---|---|---|---|
| 3,452,299 | 6/1969 | Angel | 455/83 X |
| 4,486,719 | 12/1984 | Ayasli | 330/286 |
| 4,502,027 | 2/1985 | Ayasli | 333/103 |
| 4,543,535 | 9/1985 | Ayasli | 330/277 X |
| 4,595,881 | 6/1986 | Kennan | 330/54 |
| 4,660,006 | 4/1987 | Tajima et al. | 330/286 X |
| 4,709,410 | 11/1987 | Tajima et al. | 455/326 |

OTHER PUBLICATIONS

*Modern Dictionary of Electronics*; Rudolf Graf; 5th Edition 1977; pp. 17 and 18.

Primary Examiner—Duglas W. Olms
Assistant Examiner—Ralph Smith
Attorney, Agent, or Firm—Richard A. Stoltz; Richard L. Donaldson; Rene E. Grossman

[57] ABSTRACT

Monolithic broadband semiconductor single-pole, double-throw switches are merged into distributed monolithic amplifiers and decrease the total semiconductor chip area occupied by the devices.

16 Claims, 8 Drawing Sheets

CIRCUIT TOPOLOGY OF 2 TO 20 GHz SWITCH

CHIP LAYOUT OF 2 TO 20 GHz SWITCH
CHIP SIZE: 100 x 115 MIL x 4 MIL

CHIP LAYOUT OF MMIC T/R CIRCUIT
CHIP SIZE: 250 MIL x 290 MIL x 4 MIL

CIRCUIT TOPOLOGY OF DRIVER STAGE
POWER AMPLIFIER WITH 6x200μm FETS

* DEGREE AT 20 GHz

CHIP LAYOUT OF DRIVER STAGE POWER AMPLIFIER
CHIP SIZE: 25 MIL x 75 MIL x 4 MIL

CAPACITOR TOP PLATES

AIR BRIDGE INTERCONNECTS

VIA GROUNDING, BACKSIDE PLATING

MESA ETCH

OHMIC CONTACT METALLIZATION

SCHOTTKY GATE METALLIZATION

FIRST LEVEL METAL
(INDUCTORS, CAPACITORS, S-D OVERLAY)

GAIN CURVE OF TRANSMIT PATH

GAIN CURVE OF RECEIVE PATH

5,081,706

BROADBAND MERGED SWITCH

BACKGROUND OF THE INVENTION

1. Field of the Invention

The present invention relates to semiconductor electronic devices, and, more particularly, to monolithic semiconductor broadband switches which could be used, for example, in broadband communication and radar transmit/receive modules.

2. Description of the Related Art.

Cost and reliability pressures in microwave communication and radar systems have demanded the integration of various components such as power amplifiers, low noise amplifiers, transmit/receive switches, and phase shifters on single monolithic semiconductor chips. As the number of integrated components increases, the size (chip area occupied by) each component becomes more significant; and there is a need to reduce component size.

Phased array radars include hundreds or thousands of transmit/receive modules in a matrix with about one quarter-wavelength spacing between modules; the radar beam is shaped by combining the outputs of each of the modules and is electronically steered by controlling the phase of each module. FIG. 1 is a schematic layout of a module; each of the transmit/receive switches is a single-pole, double-throw (SPDT) switch. The size, weight, power consumption, manufacturability, and cost of such a radar would be prohibitive without monolithic integration of the modules.

Known broadband SPDT switches typically use p-i-n diodes or MESFETs as shunts in connection with transmission line sections of approximately quarter-wavelength; however, such switches occupy large chip area. See for example, W. Davis, Microwave Semiconductor Circuit Design § 13.4 (van Nostrand Reinhold 1984) which describes p-i-n diode SPDTs based on the maximally flat quarter-wave coupled bandpass filter. The p-i-n diode-based switch operates by applied dc bias toggling the diodes between a low resistance state and a small series capacitance state. Also, FIGS. 2A-B illustrate in schematic and plan layout views an SPDT for 2-20 GHz with MESFET active elements: for the open pole, the series MESFET is pinched-off and the shunt MESFETs are turned on which provide low impedances at points about a quarter-wavelength (higher frequency) from the input port and thus additional isolation at high frequencies. (The precise locations for the shunt MESFETs are determined by optimization with computer simulation.) The closed pole has the MESFET gate biases reversed and matches to 50 Ω. However, the switch occupies considerable area due to the transmission line segments required.

The availability of high-gain, high-frequency microwave transistors has revived the old "distributed" or "travelling-wave" approach for broadband microwave amplification but using GaAs FETs; see Y. Ayasli et. al., Monolithic GaAs Travelling-Wave Amplifier, 17 Electronics Letters 413 (1981). Such amplifiers are similar to the distributed amplifier using electron tubes, as described in E. L. Ginzton et. al., Distributed Amplification, 36 Proc. IRE 956 (1948), in that the intrinsic gate and drain capacitances serve as parts of the shunt elements of two artificial transmission lines: the gate and drain transmission lines. If the line element values (inductances) are chosen properly, wideband amplification can be obtained with more reasonable VSWRs than is possible for an FET having the same total gate width. The Ayasli article reported results of broadband travelling-wave amplification in the 0.5 to 14 GHz band using four discrete 300 μm gate width FETs in a distributed amplifier configuration. See also U.S. Pat. No. 4,486,719 to Ayasli.

SUMMARY OF THE INVENTION

The present invention provides a broadband switch merged with a monolithic distributed device by incorporating series and shunt active devices on the input transmission line of the distributed device. In one preferred embodiment the switch is a transmit/receive (on/off) SPDT switch for a pair of distributed amplifiers made of sections of common source MESFETs with input gate transmission lines and output drain transmission lines; the switch includes MESFETs in series with the gate transmission lines plus MESFETs shunting the gate transmission lines.

The merging of the switch active devices into the transmission lines of the distributed amplifiers provides broadband switch operation with small switch area and solves the problem of the known switches.

BRIEF DESCRIPTION OF THE DRAWINGS

The drawings are schematic for clarity.

DESCRIPTION OF THE PREFERRED EMBODIMENTS

Figure 1:
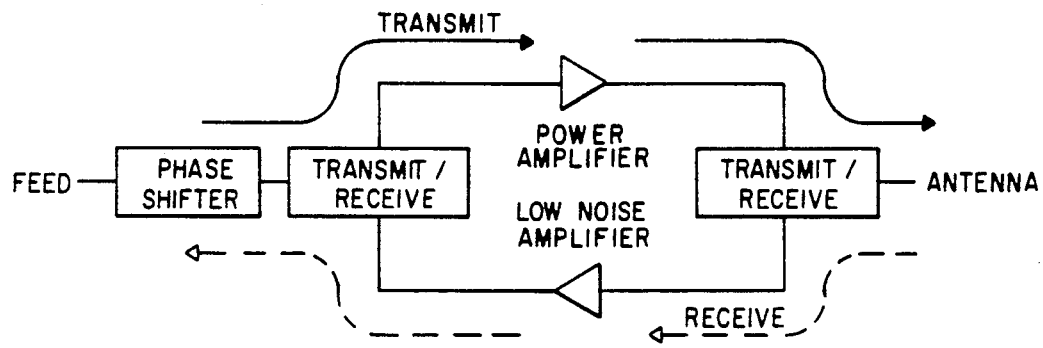
FIG. 1 is a schematic view for a transmit/receive module.
Figure 2A:
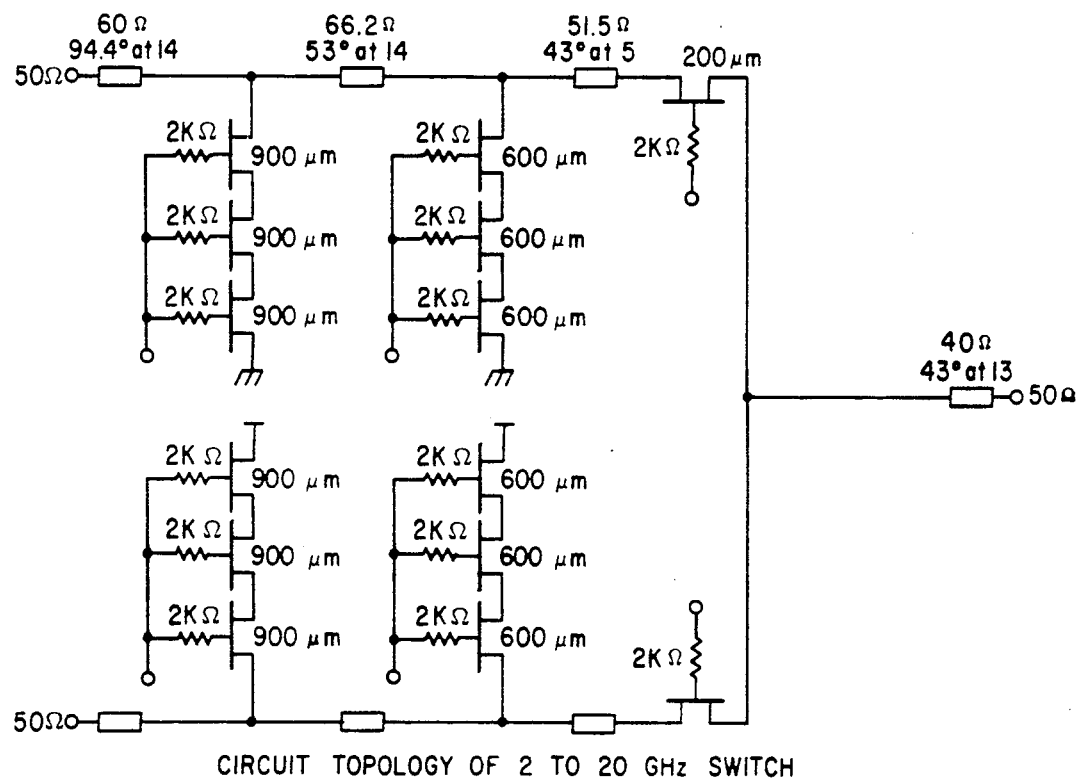
FIGS. 2A-B are schematic and plan layout views of a known SPDT.
Figure 2B:
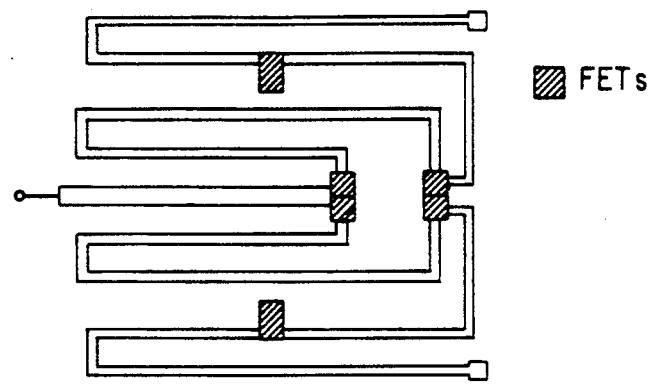
Figure 3:
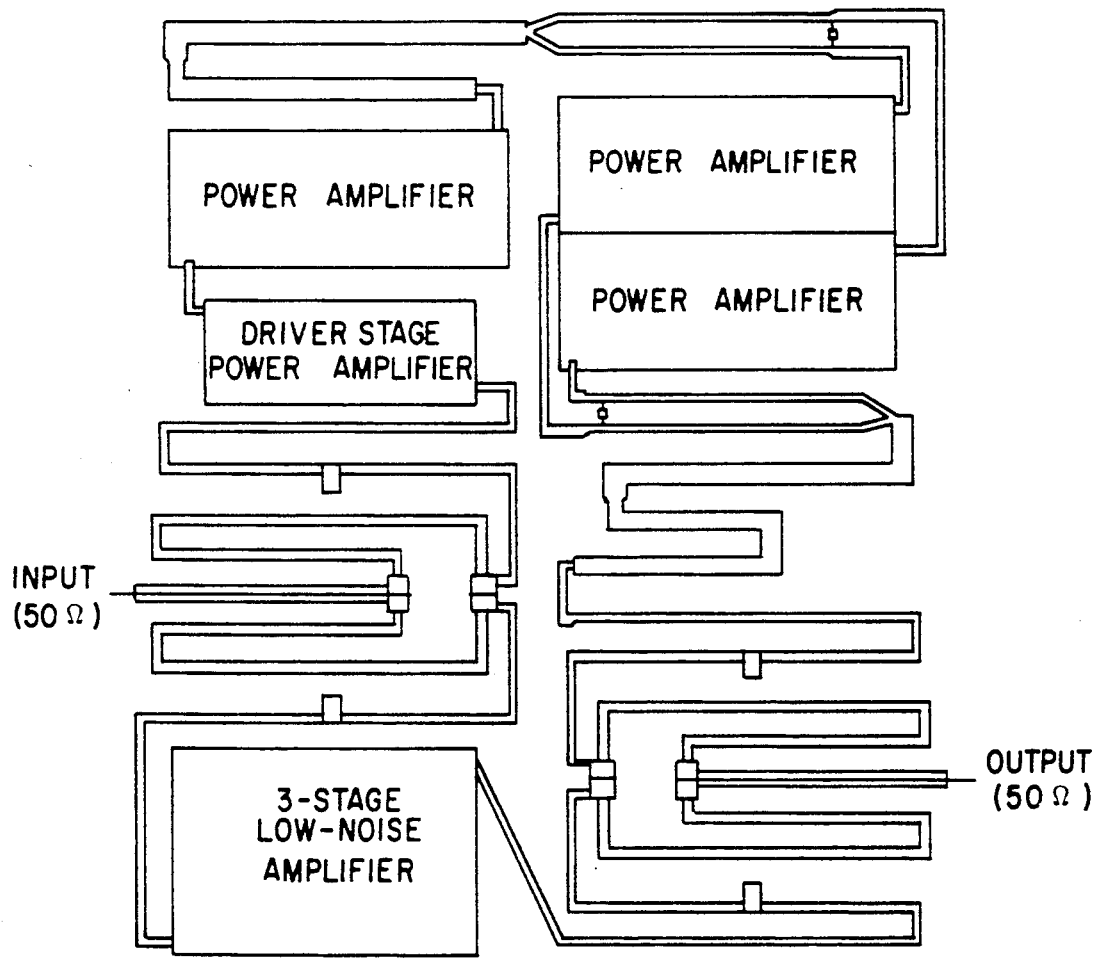
FIG. 3 is a plan layout view of a known transmit/receive module.
Figure 4A:
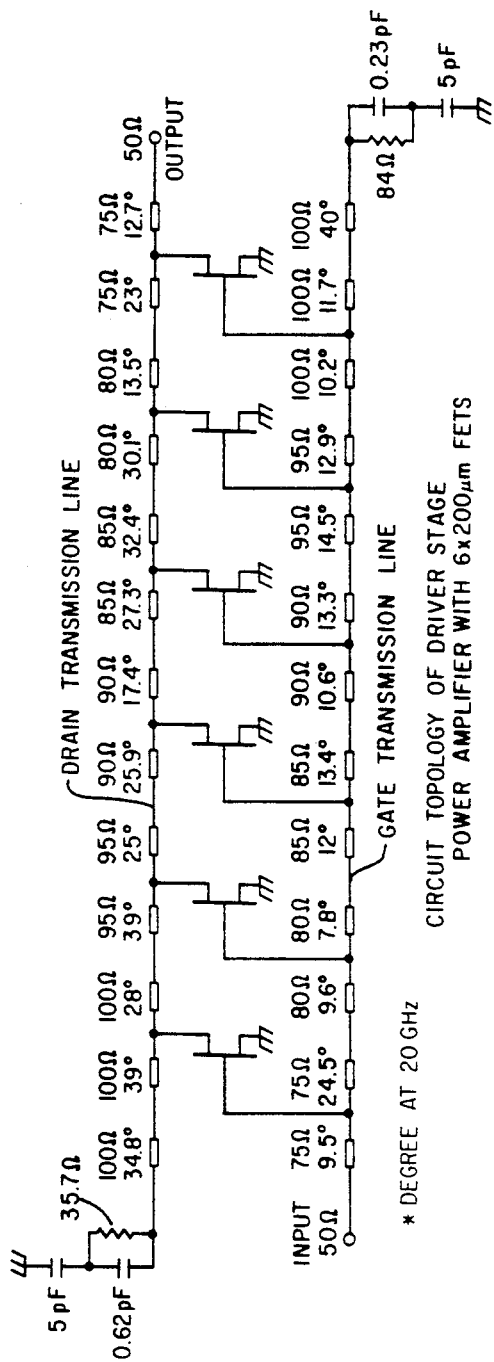
FIGS. 4A-B are schematic and plan layout views of a six-section distributed amplifier.
Figure 4B:
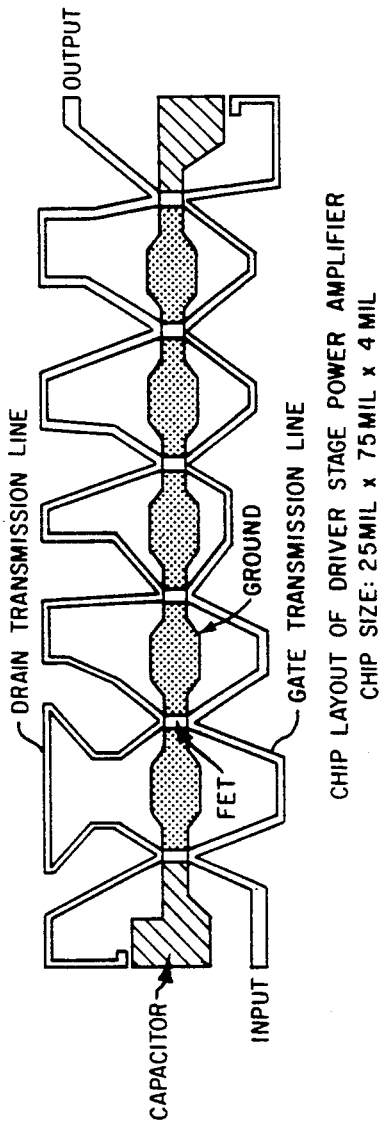

An understanding of the preferred embodiments is best approached by first considerating known single-pole, double-throw (SPDT) switches as incorporated into a monolithic transmit/receive module. FIG. 3 is a schematic plan layout view of a broadband (2-20 GHz) transmit/receive module of the type shown in FIG. 1 (which also includes a phase shifter) and incorporating two broadband SPDTs of the type shown in FIGS. 2A-B. The module of FIG. 3 employs distributed (travelling-wave) amplifiers for both the power amplifiers and the low-noise amplifiers; FIGS. 4A-B are schematic and plan layout views of the driver stage power amplifier for the module of FIG. 3. Note that the SPDTs occupy about as much chip area as the amplifiers.

Figure 5:
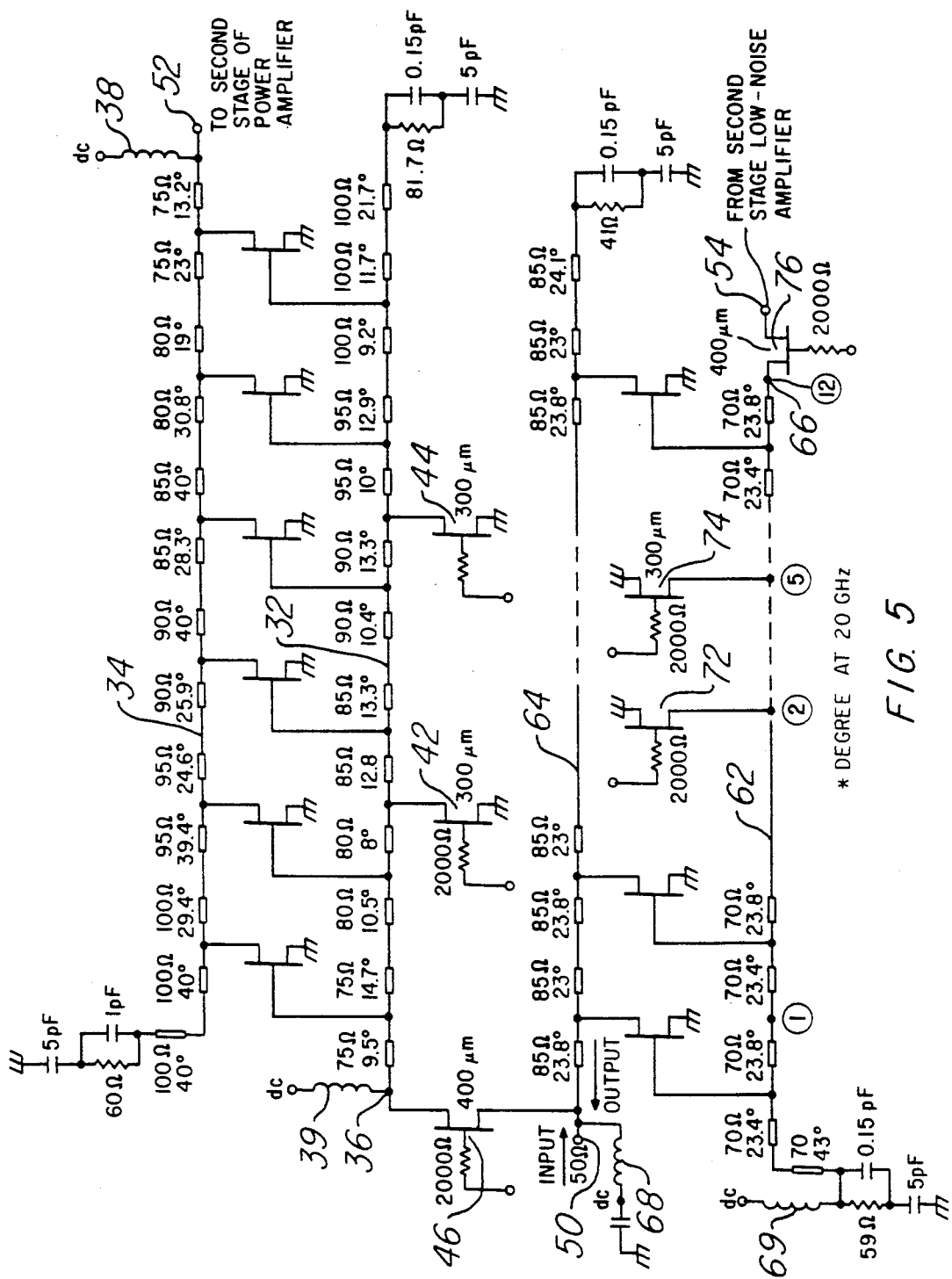
FIG. 5 is a schematic view of a first preferred embodiment merged switch.

FIG. 5 illustrates in schematic view first preferred embodiment SPDT switch merged with two distributed amplifiers as could be incorporated into the module of FIG. 3. In particular, the upper portion of FIG. 5 is a six-section distributed amplifier with gate transmission line 32 and drain transmission line 34 similar to the distributed amplifier of FIGS. 4A-B but with shunt MESFETs 42 and 44 loading gate transmission line 32 between the second and third sections and between the fourth and fifth sections, respectively. Further, series MESFET 46 is located between terminal 50 (which corresponds to the input terminal of the module of FIG. 3) and input end 36 of gate transmission line 32. The bottom portion of FIG. 5 is a twelve-section low noise distributed amplifier with gate transmission line 62 and drain transmission line 64; this low noise amplifier would be similar to the third stage of the three stage low noise amplifier of the module of FIG. 3 but with shunt MESFETs 72 and 74 between the second and third sections and between the fifth and sixth sections, respectively. Series MESFET 76 is connected between terminal 54 (which corresponds to the output of the second stage of the three stage low noise amplifier of FIG. 3) and input end 66 of gate transmission line 62. The SPDT switch appears as the MESFETs 42, 44, 46, 72, 74, and 76 plus the changes in the electrical lengths of the gate and drain transmission line segments.

Figure 6:
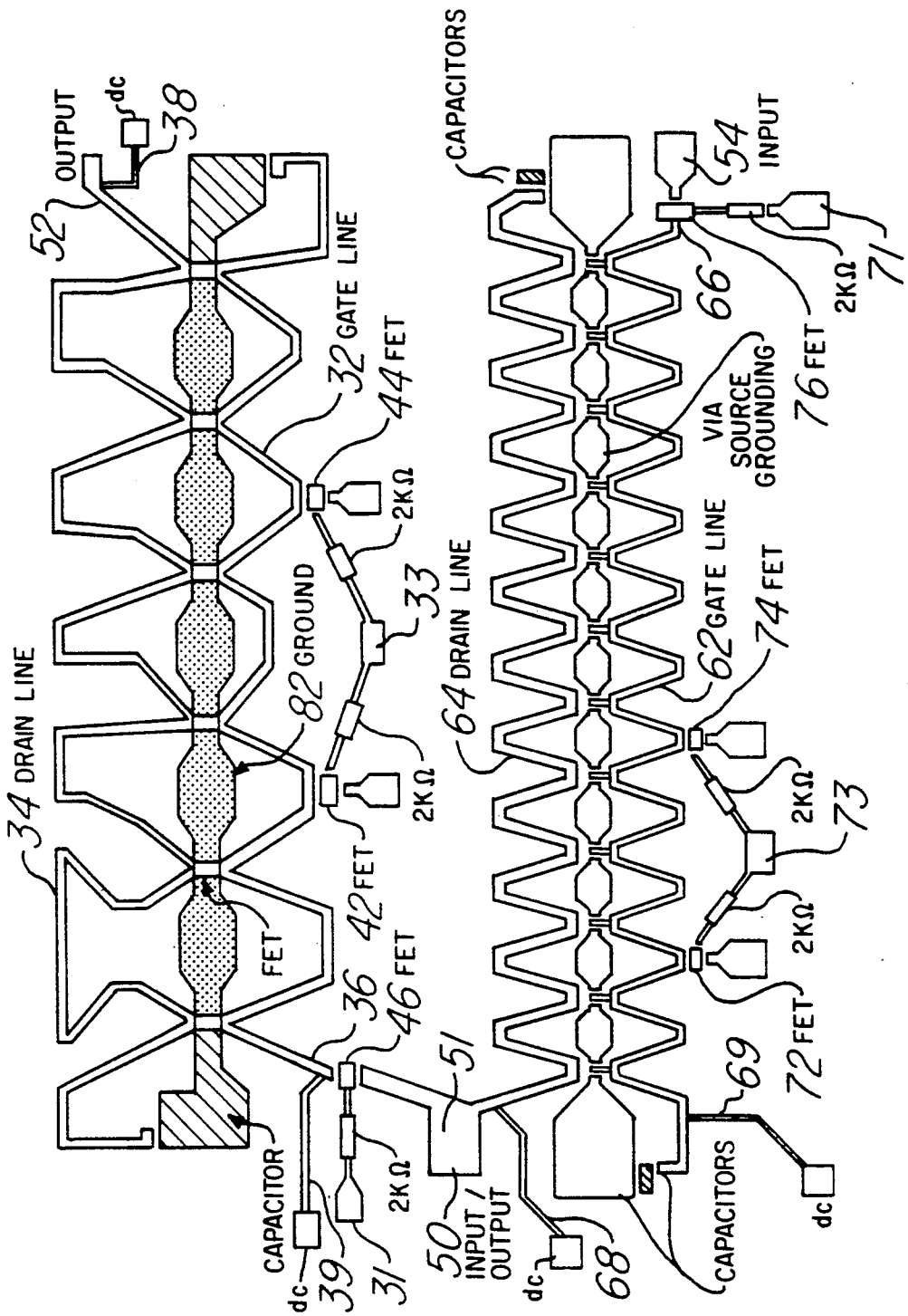
FIG. 6 is a plan layout view of the first preferred embodiment.
Figure 7A:
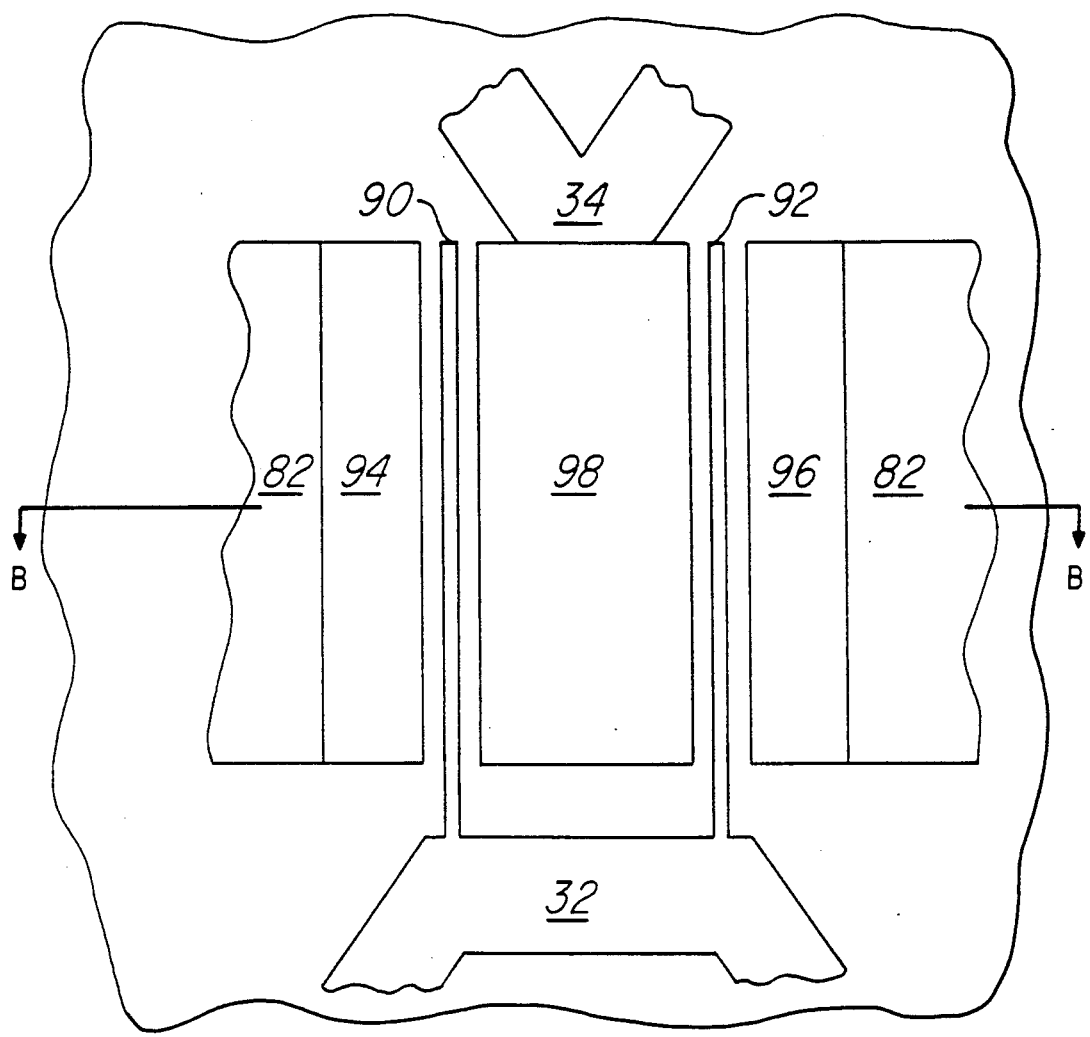
FIGS. 7A-B are plan and cross sectional elevation views of a field effect transistor in the first preferred embodiment.
Figure 7B:
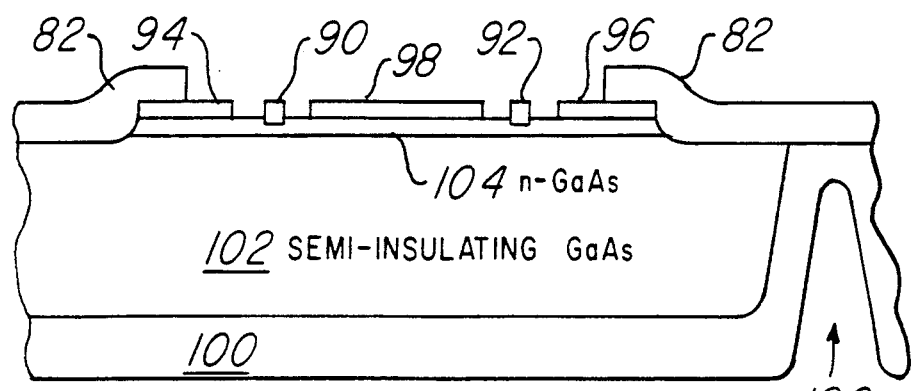

FIG. 6 is a plan layout view of the first preferred embodiment which illustrates the area saving by merging the SPDT with the two distributed amplifiers; in effect, gate transmission lines 32 and 62 are also acting as the transmission lines for the switch. In particular, the dimensions of the various components are as follows. Each of the MESFETs of the six-section amplifier has a gate length of 0.5 μm, a gate width of 200 μm, and is arranged with two gate fingers 90 and 92 connected to gate transmission line 32 and located between source contacts 94 and 96 and drain contact 98 connected to drain transmission line 34; see FIGS. 7A-B for closeup plan and cross sectional views of a single MESFET. The sources of the MESFETs are grounded through vias to the backside ground plane from the 2 μm thick titanium-gold strips 82. The sources and drains of the MESFETs have ohmic contacts made of alloyed gold-germanium-nickel-gold, and gate transmission line 32 and drain transmission line 34 are microstrip transmission lines with the top conductor made of 2 μm thick titanium-gold and with varying width depending upon the characteristic impedance designed (the GaAs substrate is about 100 μm thick, so for a $Z_o = 50\ \Omega$ the width of the conductor is about 70 μm). The ground plane is plated gold 100 on the backside of GaAs substrate 102; substrate 102 is 100 μm thick and has active device region 104 doped n type with silicon to a depth of 0.3 μm. Ground plane 100 connects to strip 82 through vias 106 in substrate 102 to ground the sources of the MESFETs. Optionally, air bridges over gates 90 and 92 and drain 98 connecting the various portions of strip 82 may be used. Typically, drain transmission lines 34 and 64 are dc biased to about 5 volts by dc sources connected through high impedance transmission line segments 38 and 68, respectively. Similarly, gate transmission lines 32 and 62 can be dc biased to about −1.5 volts by dc supplies connected through high impedance transmission line segments 39 and 69, respectively.

The lengths of the segments of transmission line and their characteristic impedances making up gate transmission line 32 and drain transmission line 34 are determined by optimization with a computer simulation such as SuperCompact. FIG. 5 shows the characteristic impedances and electrical lengths at 20 GHz; note the total electrical length of the drain line 34 segments between the first and sixth MESFETs is about 300°, the total electrical length of the gate line 32 segments between the first and sixth MESFETs is about 115°, and the characteristic impedance is tapered from 100 Ω to 75 Ω with the lower impedance at the high current end of the transmission line (input 36 for gate line 32 and output 52 for drain line 34). The differing total electrical lengths of the transmission line segments reflects the differing capacitive loading of the six MESFETs on the two transmission lines: the gate-source capacitance is about 0.23 pF for each MESFET and the drain-source capacitance is about 0.047 pF.

Figure 10A:
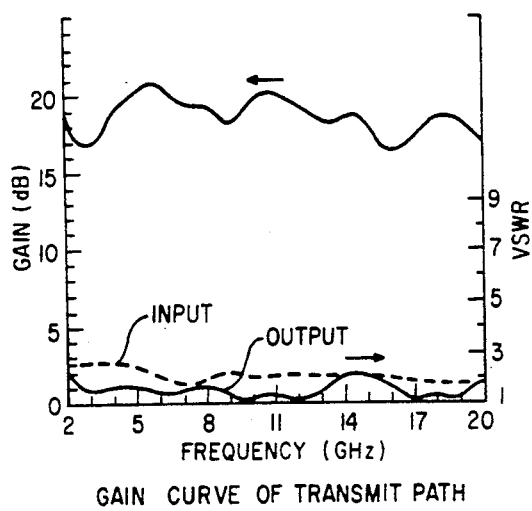
FIGS. 10A-B show performance simulations for the first preferred embodiment.
Figure 10B:
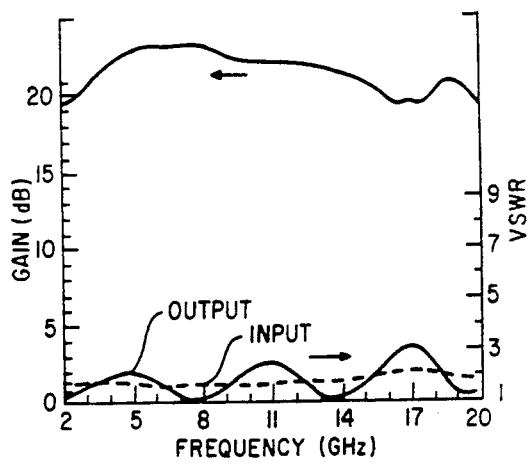

The merged switch may use three or more shunt MESFETs used on each gate transmission line, and the location of such MESFETs together with the electrical lengths of the transmission line segments (both gate and drain) would be determined by optimization through computer simulation. The use of only one shunt MESFET on each gate transmission line yields worse performance; and the use of three or more shunt MESFETs on each gate transmission line has better performance than the preferred embodiment. FIGS. 10A-B show performance simulations for the preferred embodiment.

MESFETs 42 and 44 have gate lengths of 0.5 μm, gate widths of 300 μm, drains connected to gate transmission line 32 and sources connected to ground. MESFET 46 has a gate length of 0.5 μm and a gate width of 400 μm; the source of MESFET 46 is connected to input 36 of gate transmission line 32 and the drain of MESFET 46 is connected to terminal 50. The gate of MESFET 46 is connected through a 2 kΩ resistor to a dc supply (at pad 31) that can be toggled between 0 volts and −4 volts, and the gates of MESFETs 42 and 44 are similarly each connected through a 2 kΩ resistor to a dc supply (at pad 33) that can be toggled between 0 volts and −4 volts. Note that the MESFETs are all depletion mode devices; this is also true of all other MESFETs in the distributed amplifiers and switch.

The voltages along gate transmission line 32 may have large swings, and MESFETs 42 and 44 may each be replaced by a series of MESFETs to provide sufficient voltage handling. Indeed, the SPDT switch of FIG. 2A has three MESFETs in series instead of a single MESFET for all of the shunt MESFETs.

The on-off switching operation of MESFETs 42-46 is as follows. With the gate of MESFET 46 at 0 volts, MESFET 46 is turned on and provides a very low series impedance between terminal 50 and input 36 of gate transmission line 32. And with the gates of MESFETs 42 and 44 at −4 volts MESFETs 42 and 44 are pinched off and provide high impedance shunts along gate transmission line 32. The high impedance shunts have little loading effect on line 32 except at higher frequencies where the source-drain capacitance is not negligible. Thus MESFETs 42, 44, and 46 effectively connect input 36 of gate transmission line 32 to terminal 50 under these bias conditions. The 2 kΩ resistors provide isolation.

Conversely, with the gate of MESFET 46 at −4 volts and the gates of MESFETs 42 and 44 at 0 volts, MESFET 46 is pinched off and provides a very high series impedance between terminal 50 and input 36 of gate transmission line 32. MESFETs 42 and 44 are turned on and provide low impedance shunts to ground:

this helps isolate the six-section amplifier at high frequencies where the source-drain capacitance of pinched off MESFET 46 may degrade isolation. Further, the dc bias on gate transmission line 32 can be varied to pinch off all six MESFETs in the distributed amplifier to enhance isolation.

Each of the MESFETs of the twelve-section amplifier has a gate length of 0.5 μm, a gate width of 50 μm, and is similar to the six-section MESFETs except the transmission line segments' characteristic impedances are not tapered. MESFETs 72 and 74 have gate lengths of 0.5 μm, gate widths of 300 μm, drains connected to gate transmission line 62 and sources connected to ground. MESFET 76 has a gate length of 0.5 μm and a gate width of 400 μm; the source of MESFET 76 is connected to input 66 of gate transmission line 62 and the drain of MESFET 76 is connected to terminal 54. The gate of MESFET 76 is connected through a 2KΩ resistor to a dc supply (at pad 71) that can be toggled between 0 volts and −4 volts, and the gates of MESFETs 72 and 74 are similarly connected to a dc supply (at pad 73) that can be toggled between 0 volts and −4 volts. The on-off switching operation of MESFETs 72-76 is similar to that of MESFETs 42-46 as previously described and switches between (i) connection of the twelve-section amplifier from input at terminal 54 to output at terminal 50 and (ii) isolation of the twelve-section amplifier from any input at terminal 54 and terminal 50.

The operation of the merged switch and distributed amplifiers of FIG. 6 is just a combination of the preceding on-off switching as follows. First consider the merged switch in position for transmission: the input signal at terminal 50 is to be amplified by the six-section amplifier and output at terminal 52 while the twelve-section low noise amplifier is to be disconnected from any inputs at terminal 54. Thus biases of 0 volts are applied to the gates of MESFETs 46, 72, and 74 and biases of −4 volts are applied to the gates of MESFETs 42, 44, and 76; this connects the six-section amplifier and isolates the twelve-section amplifier. Conversely, the merged switch in position for reception has these biases reversed which connects the twelve-section amplifier and isolates the six-section amplifier.

Consideration of the following description of a first preferred embodiment method of fabrication will provide further understanding of the first preferred embodiment switch characteristics and features. The first preferred embodiment method is illustrated in FIGS. 8A-G and includes the following steps.

(a) Form an n type layer of thickness 0.3 μm on a substrate of semi-insulating GaAs, such as by ion implantation of Si or growth by MOCVD. Photolithographically define active device areas (where the MESFETs will be formed) and etch away the n type layer outside of these active device areas to leave mesas; see FIG. 8A.

Figure 8E:
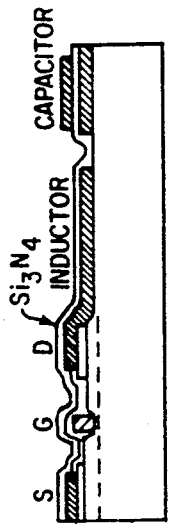
FIGS. 8A-G are schematic cross sectional elevation views of a first preferred embodiment method of fabrication.
Figure 8F:
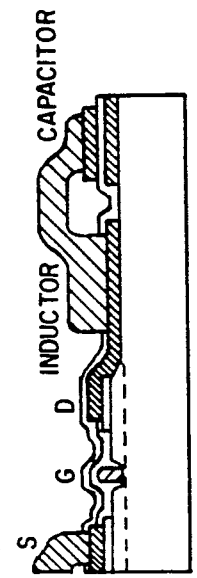
Figure 8G:
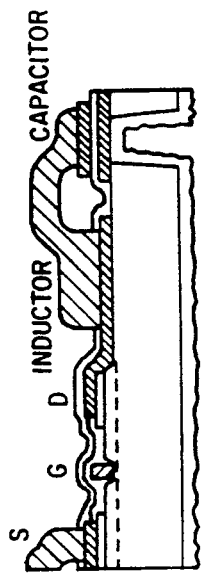
Figure 8A:
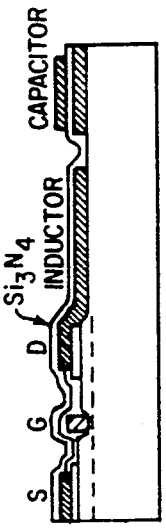
Figure 8B:
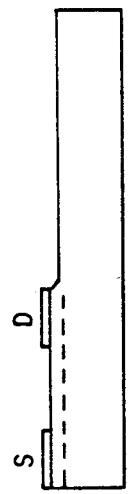
Figure 8C:

(b) Deposit gold-germanium-nickel ohmic contacts by liftoff, and alloy the gold-germanium-nickel; see FIG. 8B.

(c) Define gate locations by e-beam lithography, and deposit titanium-platinum-gold gate metal by liftoff. A gate recess may be etched prior to the gate formation to enhance MESFET performance; see FIG. 8C.

Figure 8D:
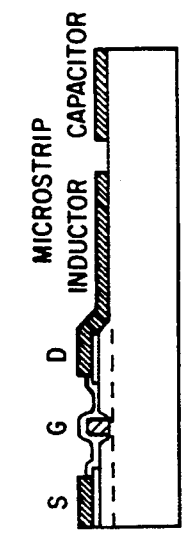

(d) Deposit metal for the microstrip conductors, dc supply connections, capacitor bottom plates, and MESFET source connections by liftoff; see FIG. 8D.

(e) Deposit silicon nitride by PECVD which will also act as capacitor dielectric, and deposit metal by liftoff to form capacitor top plates; see FIG. 8E.

(f) Form air bridges if used to connect the MESFET sources. The formation includes photolithographic patterning and metal plating; see FIG. 8F.

(g) Thin the GaAs substrate down to about 100 μm, etch by RIE vias from the substrate backside to metal grounds, and plate ground plane on the backside; see FIG. 8G.

Figure 9:
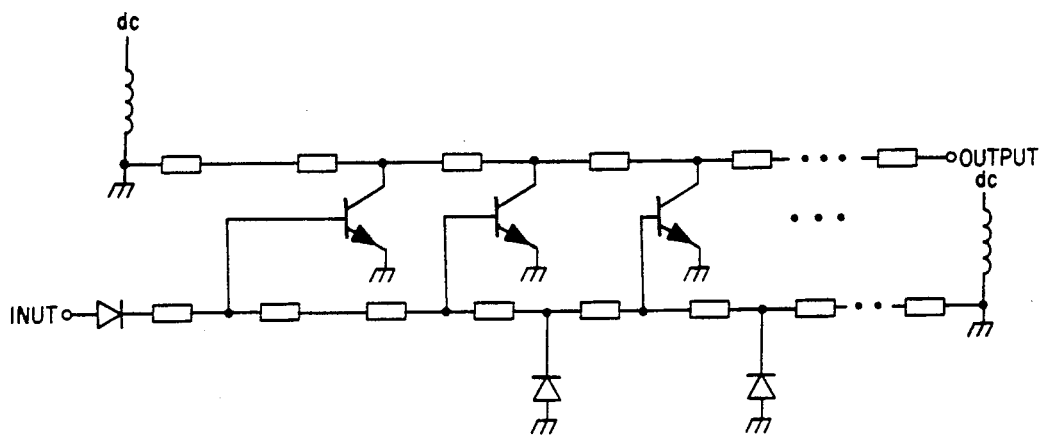
FIG. 9 is a schematic view of a second preferred embodiment merged switch.

A second preferred embodiment switch merged with a distributed device is illustrated in schematic view in FIG. 9 and includes a distributed amplifier of sections of bipolar transistors with a base transmission line and a collector transmission line plus p-i-n diodes as the active elements of the merged switch. Analogous to the first preferred embodiment, biases applied to the p-i-n diodes switches them from low resistance to high impedance (primarily capacitive) and yields the broadband on-off switching for the distributed amplifier. For simplicity, dc isolation and bias supplies are not shown for the p-i-n diodes.

MODIFICATIONS AND ADVANTAGES

Various modifications of the preferred embodiment devices and methods may be made while retaining the features of a broadband switch merged with a distributed device to reduce chip area occupied while retaining broadband operation. For example, the dimensions, shapes, layouts, and materials of the embodiments may be varied, the distributed device could be truly distributed rather than in sections or have cascoded devices in each section, MOSFET devices in silicon or HEMT or heterojunction bipolar devices in $Al_xGa_{1-x}As$ or $In_{x}Ga_{1-x}As$ material systems or IMPATT diodes immersed in polyimide can be the gain elements of the distributed device, and one, three, or more switch shunt devices may be used with possibly each shunt device actually a plurality of series connected devices. Of course, two (or more) merged switches may be used in monolithic systems such as the transmit/receive module of FIG. 1.

Further, the input and output VSWRs for the merged switch/distributed device are small across the broadband and permit cascading for increased gain. See FIGS. 10A-B which show computer simulations for the first preferred embodiment.

The invention provides the advantages of a monolithic broadband switch merged with a broadband distributed device to reduce total area occupied.

What is claimed is:

1. A broadband switch for a distributed parameter device, comprising:
   (a) a first active device having high and low impedance states in series with an input transmission line of said distributed parameter device, said distributed parameter device having said input transmission line and an output transmission line;
   (b) at least one second active device having high and low impedance states shunt connected to said input transmission line; and
   (c) impedance controls for said active devices to switch between said high and low impedance states; wherein:
   (d) said distributed parameter device is a distributed amplifier including N sections with each of said sections including an output transmission line segment, an input transmission line segment, and a gain device having an input connected to said input transmission line segment;

(e) said N input transmission line segments are connected to form said input transmission line;

(f) said N output transmission line segments are connected to form said output transmission line; and (g) said at least one second active device shunt connected to said input transmission line is connected to one of said input transmission line segments.

2. A broadband switch for a distributed parameter device, comprising:

(a) a first active device having high and low impedance states in series with an input transmission line of said distributed parameter device, said distributed parameter device having said input transmission line and an output transmission line;

(b) at least one second active device having high and low impedance states shunt connected to said input transmission line; and (c) impedance controls for said active devices to switch between said high and low impedance states; wherein:

(d) said at least one second active device shunt connected to said input transmission line is two second active devices shunt connected to said input transmission line; wherein:

(e) said distributed parameter device is a distributed amplifier including N sections with each of said sections including an output transmission line segment, an input transmission line segment, and a gain device having an input connected to said input transmission line segment and an output connected to said output transmission line segment;

(f) said N input transmission line segments are connected to form said input transmission line;

(g) said N output transmission line segments are connected to form an output transmission line; and (h) each of said two second active devices shunt connected to said input transmission line is connected to one of said input transmission line segments, and the two segments with shunt active devices differ.

3. The switch of claim 2, wherein:

(a) said input transmission line segments are microstrip transmission line segments;

(b) said output transmission line segments are microstrip transmission line segments;

(c) said gain devices are MESFETs;

(d) each of said two second active devices shunt connected is a MESFET; and (e) said first active device series connected is a MESFET.

4. The switch of claim 2, wherein:

(a) said input transmission line segments are microstrip transmission line segments;

(b) said output transmission line segments are microstrip transmission line segments;

(c) said gain devices are MESFETs;

(d) each of said two second active devices shunt connected is a plurality of MESFETs connected in series; and (e) said first active device series connected is a MESFET.

5. The switch of claim 2, wherein:

(a) said input transmission line segments are microstrip transmission line segments;

(b) said output transmission line segments are microstrip transmission line segments;

(c) said gain devices are bipolar transistors;

(d) said two second active devices shunt connected are each a p-i-n diode; and (e) said first active device series connected is a p-i-n diode.

6. A single-pole, double-throw switch for two distributed parameter devices, comprising:

(a) a first active device having high and low impedance states in series with a first input transmission line of a first of said two distributed parameter devices, said first distributed parameter device having said first input transmission line and a first output transmission line;

(b) a second active device having high and low impedance states in series with a second input transmission line of a second of said two distributed parameter devices, said second distributed parameter device having said second input transmission line and a second output transmission line;

(c) a third active device having high and low impedance states shunt connected to said first input transmission line;

(d) a fourth active device having high and low impedance states shunt connected to said second input transmission line; and (e) impedance controls for said active devices to switch between said high and low impedance states with said first and fourth active devices in the same impedance state and said second and third active devices both in an impedance state different from the impedance state of said first and fourth active devices.

7. The switch of claim 6, wherein:

(a) said first distributed parameter device is a distributed amplifier including N sections with each of said sections including an output transmission line segment, an input transmission line segment, and a gain device having an input connected to said input transmission line segment and an output connected to said output transmission line segment;

(b) said N input transmission line segments are connected to form said first input transmission line;

(c) said N output transmission line segments are connected to form an output transmission line; and (d) said third active device shunt connected to said first input transmission line is connected to one of said input transmission line segments.

8. The switch of claim 6, further comprising:

(a) a fifth active device shunt connected to said first input transmission line;

(b) a sixth active device shunt connected to said second input transmission line; and (c) controls for said fifth and sixth active devices to switch between high and low impedance states with the state of said fifth active device the same as that of said third active device and the state of said sixth active device the same as that of said fourth active device.

9. The switch of claim 8, wherein:

(a) said first distributed parameter device is a distributed amplifier including N sections with each of said sections including an output transmission line segment, an input transmission line segment, and a gain device having an input connected to said input transmission line segment and an output connected to said output transmission line segment;

(b) said N input transmission line segments are connected to form said first input transmission line;

(c) said N output transmission line segments are connected to form an output transmission line; and (d) said third active device is shunt connected to one of said N input transmission line segments and said fifth active device is shunt connected to a second of said N input transmission line segments.

10. The switch of claim 9, wherein:
(a) said input transmission line segments are microstrip transmission line segments;
(b) said output transmission line segments are microstrip transmission line segments;
(c) said gain devices are MESFETs; and
(d) each of said active devices is a MESFET.

11. The switch of claim 9, wherein:
(a) said input transmission line segments are microstrip transmission line segments;
(b) said output transmission line segments are microstrip transmission line segments;
(c) said gain devices are MESFETs;
(d) each of said first and second active devices is a MESFET; and
(e) each of said third, fourth, fifth, and sixth active devices is a plurality of series connected MESFETs.

12. A transmit/receive module, comprising:
(a) a first distributed transmit device with a first input transmission line and a first output transmission line;
(b) a second distributed transmit device with a second input transmission line and a second output transmission line, the output of said first transmit device directed to said second input transmission line;
(c) a first distributed receive device with a third input transmission line and a third output transmission line;
(d) a second distributed receive device with a fourth input transmission line and a fourth output transmission line, the output of said first receive device directed to said fourth input transmission line;
(e) a first active device having high and low impedance states in series with said first input transmission line;
(f) a second active device having high and low impedance states shunt connected to said first input transmission line;
(g) a third active device having high and low impedance states in series with said second input transmission line;
(h) a fourth active device having high and low impedance states shunt connected to said second input transmission line;
(i) a fifth active device having high and low impedance states in series with said third input transmission line;
(j) a sixth active device having high and low impedance states shunt connected to said third input transmission line;
(k) a seventh active device having high and low impedance states in series with said fourth input transmission line;
(l) an eighth active device having high and low impedance states shunt connected to said fourth input transmission line; and
(m) impedance controls for said active devices to switch between said high and low impedance states with said first, third, sixth, and eighth active devices in a first state and said second, fourth, fifth, and seventh active devices in a second state.

13. The module of claim 12, further comprising:
(a) a ninth active device shunt connected to said first input transmission line;
(b) a tenth active device shunt connected to said second input transmission line;
(c) a eleventh active device shunt connected to said third input transmission line;
(d) a twelfth active device shunt connected to said fourth input transmission line;
(e) controls for said ninth, thenth, eleventh, and twelfth active devices to switch between high and low impedance states with the state of said ninth and tenth active devices the same as that of said second and fourth active devices and the state of said eleventh and twelfth active devices the same as that of said sixth and seventh active devices.

14. The module of claim 13, wherein:
(a) said first transmit device is a distributed amplifier including N1 sections with each of said sections including an output transmission line segment, an input transmission line segment, and a gain device having an input connected to said input transmission line segment and an output connected to said output transmission line segment;
(b) said N1 input transmission line segments are connected to form said first input transmission line;
(c) N1 output transmission line segments are connected to form a first output transmission line;
(d) said second active device is shunt connected to one of said N1 input transmission line segments and said ninth active device is shunt connected to a second of said N1 input transmission line segments;
(e) said second transmit device is a distributed amplifier including N2 sections with each of said sections including an output transmission line segment, an input transmission line segment, and a gain device having an input connected to said input transmission line segment and an output connected to said output transmission line segment;
(f) said N2 input transmission line segments are connected to form said second input transmission line;
(g) said N2 output transmission line segments are connected to form a second output transmission line;
(h) said fourth active device is shunt connected to one of said N2 input transmission line segments and said tenth active device is shunt connected to a second of said N2 input transmission line segments;
(i) said first receive device is a distributed amplifier including N3 sections with each of said sections including an output transmission line segment, an input transmission line segment, and a gain device having an input connected to said input transmission line segment and an output connected to said output transmission line segment;
(j) said N3 input transmission line segments are connected to form said third input transmission line;
(k) said N3 output transmission line segments are connected to form a third output transmission line;
(l) said sixth active device is shunt connected to one of said N3 input transmission line segments and said eleventh active device is shunt connected to a second of said N3 input transmission line segments;
(m) said second receive device is a distributed amplifier including N4 sections with each of said sections including an output transmission line segment, an input transmission line segment, and a gain device having an input connected to said input transmission line segment and an output connected to said output transmission line segment;

(n) said N4 input transmission line segments are connected to form said fourth input transmission line;

(o) said N4 output transmission line segments are connected to form a fourth output transmission line; and (p) said eighth active device is shunt connected to one of said N4 input transmission line segments and said twelfth active device is shunt connected to a second of said N4 input transmission line segments.

15. The module of claim 14, wherein:
(a) said input transmission line segments are microstrip transmission line segments;
(b) said output transmission line segments are microstrip transmission line segments;
(c) said gain devices are MESFETs; and
(d) each of said active devices is a MESFET.

16. The module of claim 14, wherein:
(a) said input transmission line segments are microstrip transmission line segments;
(b) said output transmission line segments are microstrip transmission line segments;
(c) said gain devices are MESFETs;
(d) each of said first, third, fifth, and seventh active devices is a MESFET; and
(e) each of said second, fourth, sixth, eighth, ninth, tenth, eleventh, and twelfth active devices is a plurality of series connected MESFETs.

* * * * *